(12) United States Patent
Adam et al.

(10) Patent No.: US 7,642,802 B2
(45) Date of Patent: Jan. 5, 2010

(54) METHOD AND APPARATUS FOR COOLING NON-NATIVE INSTRUMENT IN AUTOMATIC TEST EQUIPMENT

(75) Inventors: Sean P. Adam, Wrentham, MA (US); Rhonda L. Allain, Newton, NH (US); Sten J. Peeters, Canton, MA (US); Urszula B. Tasto, Wilmington, MA (US); John P. Toscano, Auburn, MA (US); Jack M. Thompson, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 186 days.

(21) Appl. No.: 11/906,158

(22) Filed: Sep. 28, 2007

(65) Prior Publication Data

US 2008/0136439 A1   Jun. 12, 2008

Related U.S. Application Data

(60) Provisional application No. 60/848,323, filed on Sep. 29, 2006.

(51) Int. Cl.
*G01R 31/26* (2006.01)

(52) U.S. Cl. .................................... 324/765

(58) Field of Classification Search ................. 324/765, 324/760, 158.1; 438/14–18; 257/48; 165/254, 165/104.33, 908, 272, 64, 80.4
See application file for complete search history.

(56) References Cited

U.S. PATENT DOCUMENTS

| | | | |
|---|---|---|---|
| 5,952,842 A | 9/1999 | Fujimoto | |
| 6,587,979 B1 | 7/2003 | Kraus et al. | |
| 6,622,272 B1 | 9/2003 | Haverkamp et al. | |
| 6,904,968 B2 * | 6/2005 | Beitelmal et al. | 165/247 |
| 6,975,130 B2 | 12/2005 | Yevmenenko | |
| 7,134,484 B2 * | 11/2006 | Mok et al. | 165/80.4 |
| 2002/0118033 A1 | 8/2002 | Koide | |
| 2004/0189280 A1 | 9/2004 | Mirkhani | |
| 2005/0039888 A1 | 2/2005 | Pfahnl et al. | |
| 2005/0115257 A1 | 6/2005 | Goth et al. | |
| 2005/0261856 A1 | 11/2005 | Kushnick et al. | |
| 2006/0082358 A1 | 4/2006 | Conner | |
| 2006/0126292 A1 | 6/2006 | Pfahnl et al. | |

OTHER PUBLICATIONS

Internations Search Report and the Written Opinion from International Application No. PCT/US2007/020912, dated Jun. 10, 2008.

* cited by examiner

*Primary Examiner*—Ha Tran T Nguyen
*Assistant Examiner*—Tung X Nguyen
(74) *Attorney, Agent, or Firm*—Wolf, Greenfield & Sacks, P.C.

(57) ABSTRACT

An adapter frame is configured to receive a non-native test instrument module and is further configured for coupling within a test head of automatic semiconductor device test equipment. The adapter frame includes interfaces for operatively connecting the test instrument module to the test head using the existing slots of the test head. Interfaces may include mechanical interfaces, such as liquid cooling interfaces and other suitable interfaces. Additional software and/or hardware components may be included on the adapter frame to integrate the non-native test instrument module into the existing test equipment.

9 Claims, 7 Drawing Sheets

METHOD AND APPARATUS FOR COOLING NON-NATIVE INSTRUMENT IN AUTOMATIC TEST EQUIPMENT

RELATED APPLICATIONS

This application claims the benefit under 35 U.S.C. § 119 (e) to U.S. Provisional Application Ser. No. 60/848,323, entitled "Method and Apparatus for Integrating Non-Native Instrument into Automatic Test Equipment", filed on Sep. 29, 2006, which is hereby incorporated by reference.

FIELD OF THE INVENTION

The invention relates generally to automatic test equipment and more particularly to the use of non-native instruments in automatic test equipment.

DISCUSSION OF THE RELATED ART

Semiconductor devices are tested, often multiple times, during their manufacture. A piece of automatic test equipment, referred to as a "tester," is used to generate test signals that stimulate a device under test (DUT) and to measure the response. The tester determines whether a DUT is operating properly by comparing the response evoked by a carefully controlled test pattern with an expected response.

To fully test devices, the tester should generate and measure signals such as may be found in the operating environment of those devices. Increasing complexity of semiconductor chips has led to automatic test equipment that generates and measures complex signals. Most semiconductor devices generate or respond to high speed digital signals. Many devices, such as disk drive controllers and processors for video signals, also generate or respond to analog signals. Entire systems, containing both analog and digital electronics, are now widely implemented on single semiconductor devices.

Because of the number and complexity of signals that typically need to be produced by a tester, including both digital and analog signals, test equipment is typically made to contain multiple instruments. Each test instrument performs a specific function, such as generating high speed digital signals or producing an analog waveform that has a programmed characteristic. Multiple test instruments are installed in a tester to provide the combination of analog and digital signals needed to test a particular device. Creating test instruments that provide separate test functions provides a flexible way to create a test system that can generate and measure a set of test signals required for testing many different types of semiconductor devices.

SUMMARY

A semiconductor device tester typically includes many test instruments that are designed for use with that specific type of tester. Semiconductor device manufacturers may have multiple types of testers and may want to use test instruments developed for one type of tester with a different type of tester. The design of a given test instrument and a module on which the test instrument is mounted is typically closely tied to its tester so that the test instrument module and the tester are compatible. For a given type of tester, it is known to use test instruments which were not designed for use with the given tester type (hereinafter, "non-native instruments"), and typically the non-native instruments are housed separately from the test head. However, a non-native instrument would likely not be usable in a test head because of incompatibility between the non-native instrument and the test head, including couplings for liquid cooling.

According to embodiments of the invention disclosed herein, an interface apparatus, such as an adapter frame, provides an interface between a non-native instrument and a slot within a tester, the slot being designed for a native instrument.

According to one aspect of the invention, an automatic semiconductor device test system includes a test head having a plurality of interfaces adapted to interface with test instrument modules. At least one of the interfaces of the test head includes a first liquid coolant interface having a first format. The system also includes a test instrument module having a second liquid coolant interface which is incompatible with the first format of the first liquid coolant interface of the test head. The system further includes an adapter that couples the test instrument module to the test head. The adapter couples the first liquid coolant interface of the test head to the second liquid coolant interface of the test instrument module.

According to another aspect of the invention, a method is provided for configuring an automatic semiconductor device test system having a test head configured to provide test signals to a device under test and to receive response signals from the device under test. The method includes physically coupling a test instrument module to an adapter frame, physically coupling the adapter frame to an instrument support assembly within the test head, coupling test signals between the test instrument module and the test head via the adapter frame, and coupling response signals between the test head and the test instrument module via the adapter frame. The method also includes coupling inlet liquid coolant between a liquid cooling system of the test head and a liquid cooling system of the test instrument module via the adapter frame. Further, the method includes coupling outlet liquid coolant between the liquid cooling system of test instrument module and the liquid cooling system of the test head via the adapter frame.

According to a further aspect of the invention, an adapter frame is provided for integrating a test instrument module within a test head of an automatic semiconductor device test system, the test head having a plurality of slots, and each slot being adapted to receive an instrument. The adapter frame includes a first mechanical interface configured to receive a test instrument module, and a separable second mechanical interface configured to mount the adapter frame within the test head in a slot of the plurality of slots. The adapter also includes a separable first electrical interface separably couplable to an electrical module interface in the test head and configured to transfer data signals between the test head and the adapter frame, and a second electrical interface couplable to an electrical interface of the test instrument module and configured to transfer data signals between the adapter frame and the test instrument module. The adapter frame further includes a third electrical interface couplable to an electrical interface of the test instrument module and configured to transfer test signals between the test instrument module and the adapter frame, and a separable fourth electrical interface separably couplable to a signal delivery interface of the test head and configured to transfer test signals between the adapter frame and the signal delivery interface. The adapter frame also includes a separable first liquid coolant interface which is separably couplable to a liquid cooling system of the test head and configured to transfer liquid coolant between the test head and the adapter frame. The adapter frame further includes a second liquid coolant interface couplable to a liquid cooling system of the test instrument module and configured to transfer the liquid coolant to the test instrument module. The adapter frame also includes a third liquid coolant interface couplable to the liquid cooling system of the test instrument module and configured to transfer the liquid coolant between the test instrument module and the adapter frame. Additionally, the adapter frame includes a separable fourth liquid coolant interface separably couplable to the liquid cooling system of the test head and configured to transfer the liquid coolant between the adapter frame and the test head.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
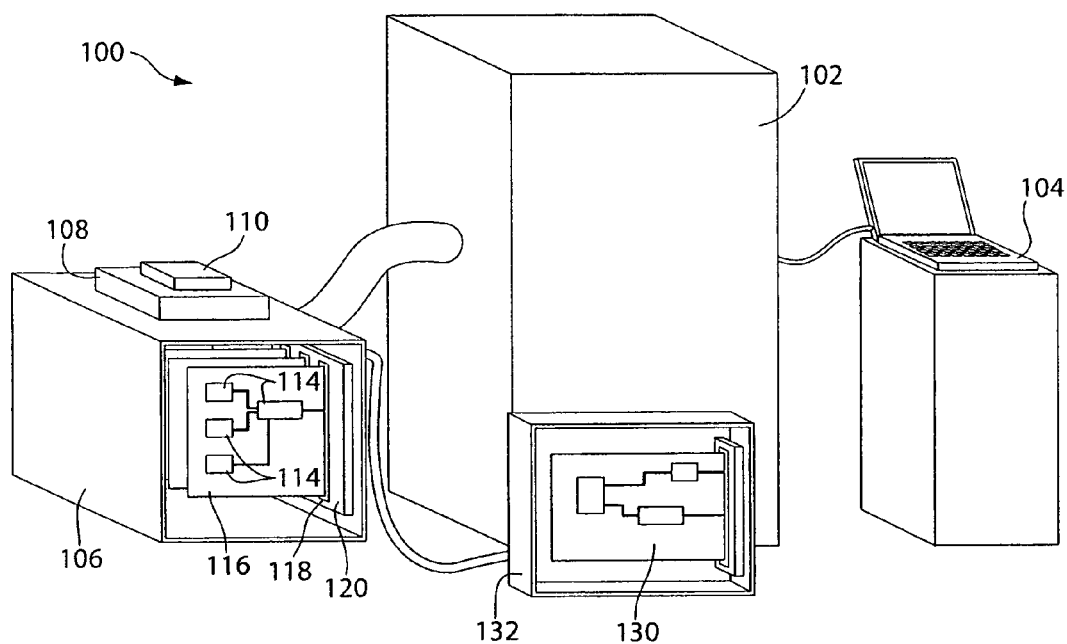
FIG. 1 illustrates a conventional test system including a non-native test instrument module mounted outside of a test head.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

A conventional tester 100 is shown in FIG. 1 and includes a controller 102 which may include a separate tester PC 104, a test head 106, and an interface 108 to a DUT 110. Some testers do not include a physically separate test head, but instead incorporate the functional components of the test head within the console of controller 102. For purposes herein, a tester is considered to have a test head even if the typical components of a test head (e.g., structures which support the test instruments) are not contained in a structure that is physically separate from the controller. Interface 108 may be a device interface board (DIB) for use when testing packaged parts, or interface 108 may be a probe card when testing chips on a wafer. With regard to embodiments of the invention described herein, any suitable interface 108 (including interfaces other than DIBs and probe cards) may be employed.

To test a DUT 110, DUT 110 is attached to interface 108 and DUT 110 receives test signals generated by various test instruments located within test head 106. A test instrument may comprise a plurality of components 114 positioned on a test instrument module 116 which is connected to a slot 118 of an instrument support assembly 120 within test head 106. The DUT sends response signals back to the test instruments, and the test instruments measure the response signals. Typically, actual response signals are compared to expected response signals within the test instruments. Results from the test instruments (e.g., a pass/fail indication, a failure at step x of a test pattern, or a trace of execution prior to failure) may be sent to controller 102 via test head 106 for further analysis.

Also shown in FIG. 1 is a prior art method of adding a non-native test instrument module 130 to the existing tester 106. The test instrument module 130 is housed in a separate console 132 and operatively coupled to both controller 102 and test head 106 via various buses, fiber optic cables, signal wires and so on.

According to embodiments of the invention disclosed herein, an adapter frame provides an interface between a non-native instrument and a slot (designed to receive a native instrument) within a test head. Maintaining a close physical proximity between the test instruments and the DUT may aid in synchronization and improve the accuracy of testing. Additionally, by incorporating a non-native instrument into the test head instead of housing it in a separate structure, various systems already within the test head may be used instead of duplicating the systems within a separate console. For example, the non-native test instrument module may take advantage of already available liquid cooling systems, air cooling systems, power supplies, etc. which may be present within the test head. Further, in some embodiments, by providing an adapter frame, integration of a non-native instrument may be more quickly and easily achieved as compared to a separate setup.

An adapter frame configured to couple a test instrument module and a test head may include mechanical interfaces, signal interfaces such as electrical interfaces or fiber optic interfaces, power interfaces, cooling system interfaces, and other suitable interfaces. For each type of interface, a first interface may be provided between the adapter frame and the test head, and a second interface may be provided between the adapter frame and the test instrument module that is coupled to the adapter frame. For purposes herein, to facilitate description, the collection of interfaces designed to couple the adapter frame and the test head is referred to as the "external interfaces". Similarly, for purposes herein, the collection of interfaces designed to couple the adapter frame and the test instrument module is referred to as "internal interfaces". The terms "external" and "internal" in this respect are not intended to connote the physical position of an interface on the adapter frame, that is, an external interface (i.e., an interface of the adapter frame and the test head) may be positioned on an inward-facing edge or surface of the adapter frame and still be considered an external interface. In many embodiments, the external interfaces are positioned on or toward an outer edge of the adapter frame and the internal interface are positioned on or toward an inner edge of the adapter frame, but the internal and external interfaces may be positioned at any suitable location on the adapter frame. For example, in one embodiment, the adapter frame may be longitudinal vertical strip with internal interfaces on the left side and external interfaces on the right side. In this respect, the term "frame," for purposes herein, means a physical structure constructed and arranged to receive a test instrument module and further configured for attachment to an instrument support assembly.

An adapter frame does not necessarily have to have a rectangular shape or need to form or surround an inner area.

The adapter frame and its external interfaces may be specifically configured for a known test head architecture (for example, certain sized slots and/or backplane connectors). In some cases, multiple different test heads subscribe to a standardized slot and interface configuration, and the same adapter frame (or similar adapter frames having the same outer interfaces) may be used with any one of the test heads.

Similarly, the adapter frame and its internal interfaces may be specifically configured for a known test instrument module architecture. If various different test instrument modules have the same architecture, the adapter frame may be capable of receiving any one of the test instrument modules. In some embodiments, adapter frame templates may be produced in which the adapter frame is configured for attachment to a specific test head architecture, and internal interfaces may be easily added or converted for various test instrument module architectures.

Figure 2A:
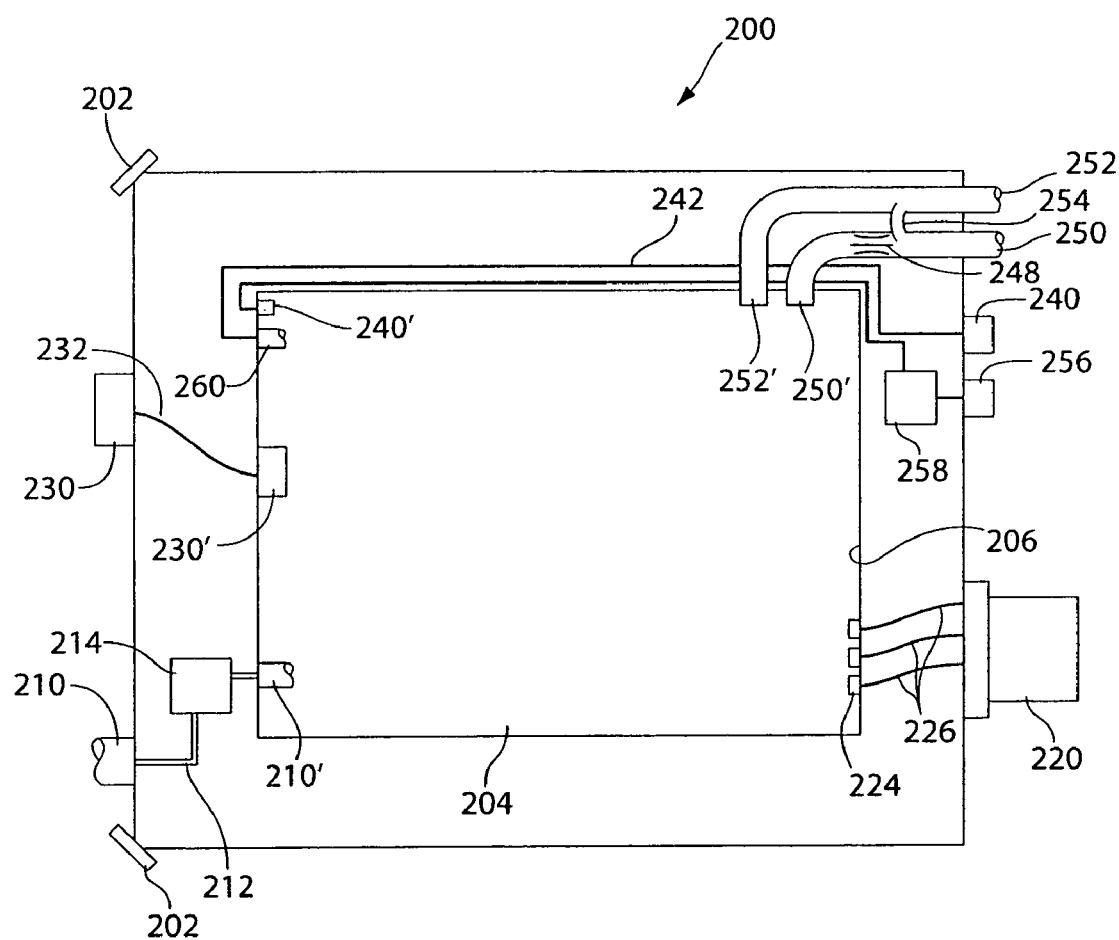
FIG. 2a illustrates a test instrument module adapter frame according to one embodiment of the invention.

One embodiment of an interface for integrating a non-native instrument into a test head is shown in FIG. 2a. An adapter frame 200 is configured to receive a test instrument module and is further configured to be received by a slot or other suitable support assembly within a tester. Adapter frame 200 may have an external perimeter shape which is similar to the external perimeter shape of test instrument modules native to the test head, for example, a rectangular shape as shown. The adapter frame may include latches 202 for providing a mechanical connection with the receiving slot of the test head.

Adapter frame 200 may define an empty inner portion 204 where a test instrument module is held by connections along an inner edge 206. In some embodiments, an empty portion may not be present, for example, adapter frame 200 may comprise a solid rectangular-shaped support to which a test instrument module may be mounted. In one exemplary embodiment, adapter frame 200 may be configured to receive and hold a test instrument module having a width of 394 mm, a height of 510 mm and a thickness of 488 mm. Of course adapter frame 200 may be configured to receive and hold a test instrument module having different dimensions and/or may be configured to receive and hold different test instrument modules that span ranges of the various dimensions. Additionally, as will be evident to one of skill in the art, the adapter frame does not need to be rectangular as it may be any suitable shape, for example square and trapezoidal.

Various interfaces on inner edge 206 of adapter frame 200 may be configured to be coupled to corresponding interfaces on a test instrument module, while interfaces on outer portion of the adapter frame may be configured to be coupled to corresponding interfaces of the test head. The interconnection between an internal interface and an external interface on the adapter frame may be as simple as a wire or cable. For example, power may be provided by the test head to the adapter frame through a first power supply interface 210. A power cord 212 may travel directly from the first power supply interface to a second power supply interface 210' which connects to the test instrument module. For various interconnected interfaces, however, various components may be provided on adapter frame 200. For instance, circuitry such as a filter 214 may be provided on adapter frame 200 between the first and second power supply interfaces to reduce or eliminate common-mode coupling of instrument noise into the power supply system supplying power to other instruments in the test head.

Some of the interfaces which may be included on adapter frame 200 include: liquid cooling system interfaces; power supply interfaces; fiber optic bus interfaces; test signal interfaces; response signal interfaces; digital volt meter (DVM) interfaces. Each of the above-mentioned interfaces is discussed in more detail below. As will be evident to one of skill in the art, in some embodiments, not every one of the above-mentioned interfaces needs to be present and combinations of two or more of the interfaces may be included in an adapter frame. In some embodiments, other interfaces may be present.

Signal Delivery Interface

A signal delivery interface 220 may be used to provide test signals to, and receive response signals from, the interface (e.g., DIB) or DUT. Signal delivery interface 220 may be configured to connect with the number and type of corresponding interfaces present in the test head, which is configured to receive native instruments. In some embodiments, signal delivery interface 220 may be configured to supply 64 coax-signals to the DIB. On the inner side of adapter frame 200, a standard connector such as an SMA connector 224 may be used. Three conductive lines 226 are shown in FIG. 2a for simplicity of illustration, but any suitable number and type of conductive lines may be provided, for example, 64 conductive coaxial lines.

Power, Grounding and Power Fault and Anomaly Detection

Adapter frame 200 may be configured to connect with a power source used by native instruments, and may be constructed and arranged to provide a same or different voltage to a non-native test instrument module. In some embodiments, 48 volt power is supplied from the test head to the test instrument module. Power may be supplied to the test instrument module via power interfaces 210 and 210', which in some embodiments may be rated at 35 amperes. A power circuit board which may include components such as filter 214 for example, may be provided to add a translation stage and/or to reduce or eliminate common-mode coupling of instrument noise into the power supply system.

In some embodiments, any power sequence and fault implementation present on the test instrument module may be converted with a power circuit board to conform to a system monitoring service provided by the tester.

Calibration Connections

Any suitable interfaces and conductive lines may be used to convey and receive signals between the test instrument module and one or more calibration resources, such as a DVM, to measure signals produced by the test instrument module or controlled sources to provide signals of known characteristics to be measured by the test instrument module. In the embodiment of FIG. 2a, a first calibration interface 230 is connected to a second calibration interface 230' with a conductive line 232.

To calibrate the non-native test instrument module, an external controlled source (not shown) may be connected to the test instrument module through first calibration interface 230, conductive line 232, and second calibration interface 230'. Alternatively, the test instrument module may be calibrated using system calibration resources located on a support board (not shown in FIG. 2a) which are also connected to the DIB. The two described options for calibrating the DVM are provided as examples only, and other suitable methods of calibrating the DVM may be used.

Optical Bus Connection

An internal optical bus connector 240' to the test instrument module may be provided. An external optical bus connector 240 provides a link between an optical fiber 242 of adapter frame 200 and an optical fiber (not shown) that is routed to the controller. External optical bus connector 240 may be configured to connect with an existing interface of the optical fiber routed to the controller, the existing interface being configured for a native test instrument module. From the controller, the optical fiber may be routed to the tester PC and may be interfaced to a PCI-based or PCI-Express-based optical card.

Liquid Cooling

An external inlet liquid coolant interface 250 and an external outlet liquid coolant interface 252 are configured to connect with the liquid cooling system of test head, and an internal inlet liquid coolant interface 250' and internal outlet liquid coolant interface 252' are configured to connect with the liquid cooling system of the test instrument module. If the coolant pressure provided by the test head cooling system exceeds the pressure that the test instrument module can handle, a restrictor 248 and/or a bypass loop 254 may be provided on adapter frame 200 to reduce the pressure. Also, if the test head cooling system is designed for a larger pressure drop which is not provided by the test instrument module, additional resistance may be provided within conduits on adapter frame 200. In some embodiments, the liquid cooling system may provide power dissipation of 1,540 watts per slot.

Reference Clock

The non-native test instrument module may require a reference clock signal with a different frequency than that provided by the tester. Accordingly, adapter frame 200 may include circuitry to derive a reference clock signal of suitable frequency from the tester reference clock. For example, in one embodiment, the tester may provide a reference clock frequency of 100 MHz to adapter frame 200 via an external clock interface 256. Reference clock circuitry 258 may derive a 250 MHz reference clock signal from this 100 MHz signal and provide the 250 MHz signal to the non-native test instrument module via an interface such as a Dsync connector 260. Synchronization to the digital pattern may be achieved in any suitable way, such as by using a triggering signal provided through the DIB by a digital instrument in the test head.

Software

Control of the test instrument module from the tester PC may be via any suitable control software. In some embodiments, the same operating system used for native instruments may be used as the operating system for controlling the non-native instrument. In some embodiments, Excel-based operating system software may be adapted to interact with other modules written in Visual Basic for Applications (VBA). One example of Excel-based operating system software which is used in testers to control native instruments is IG-XL, available from Teradyne, Inc. The test operating system may have the ability to call test instrument module-specific dynamically linked libraries (DLLs) through VBA or other suitable software application. The tester PC may include bus communication software for communication with the test instrument module driver and hardware. Application Program Interfaces (APIs) of the test instrument module may be accessible with VBA once a user references the DLL. The user may control calibration and diagnostics services using the test instrument module APIs. A harness in VBA may be provided to support registering and raising alarm conditions.

Figure 2B:
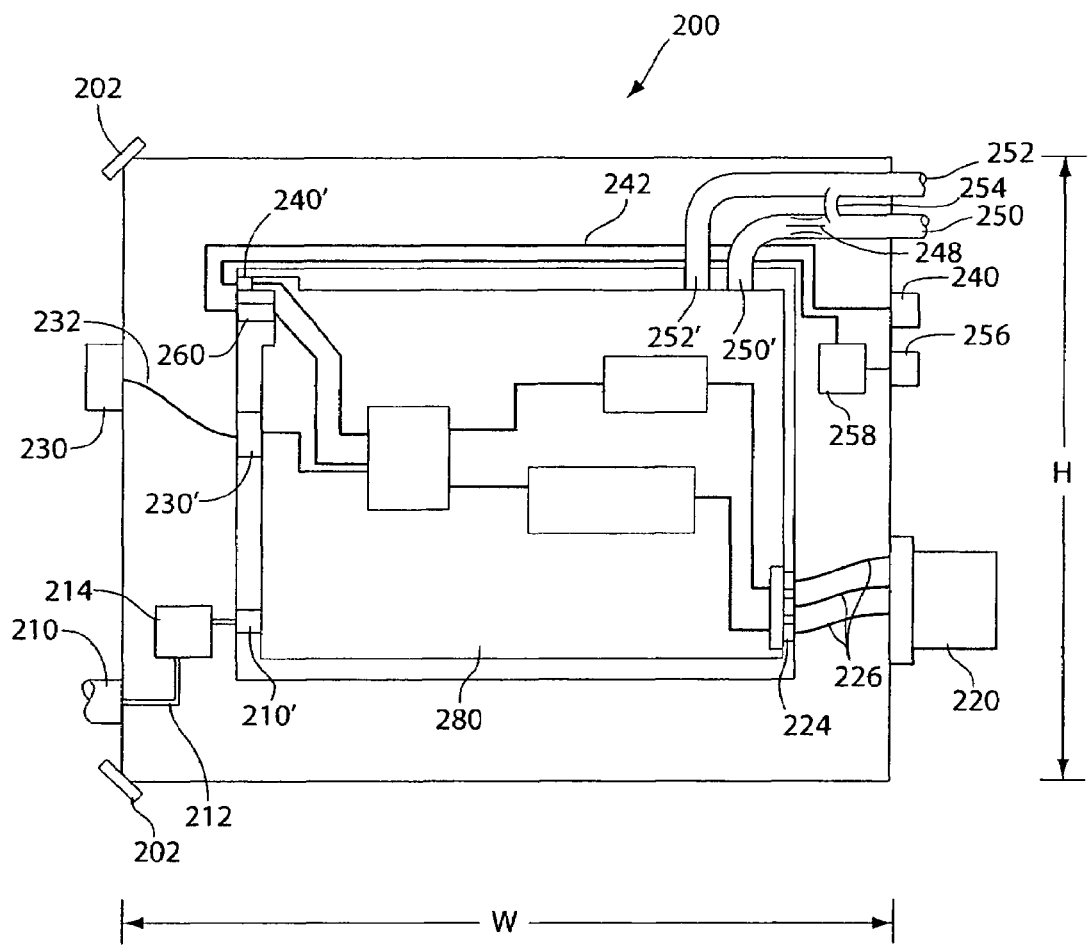
FIG. 2b illustrates a test instrument module connected to a test instrument module adapter frame according to one embodiment of the invention.

Referring now to FIG. 2b, an adapter frame is shown with a test instrument module 280 attached. In some embodiments, the connections between the internal interfaces of adapter frame 200 and the interfaces of test instrument module 280 may be separable in that the connections may be separated without damaging or altering the connectors. Conversely, in some embodiments, some or all of the connections may be more permanent in that sophisticated tools and/or irreversible physical damage may be required to disconnect interfaces.

The adapter frame shown in FIGS. 2a and 2b is configured such that the width and height are unaffected by the width and height of the test instrument module. In some embodiments, the adapter frame may not encompass the test instrument module, and instead the test instrument module may attach to one side of the adapter frame.

Figure 3:
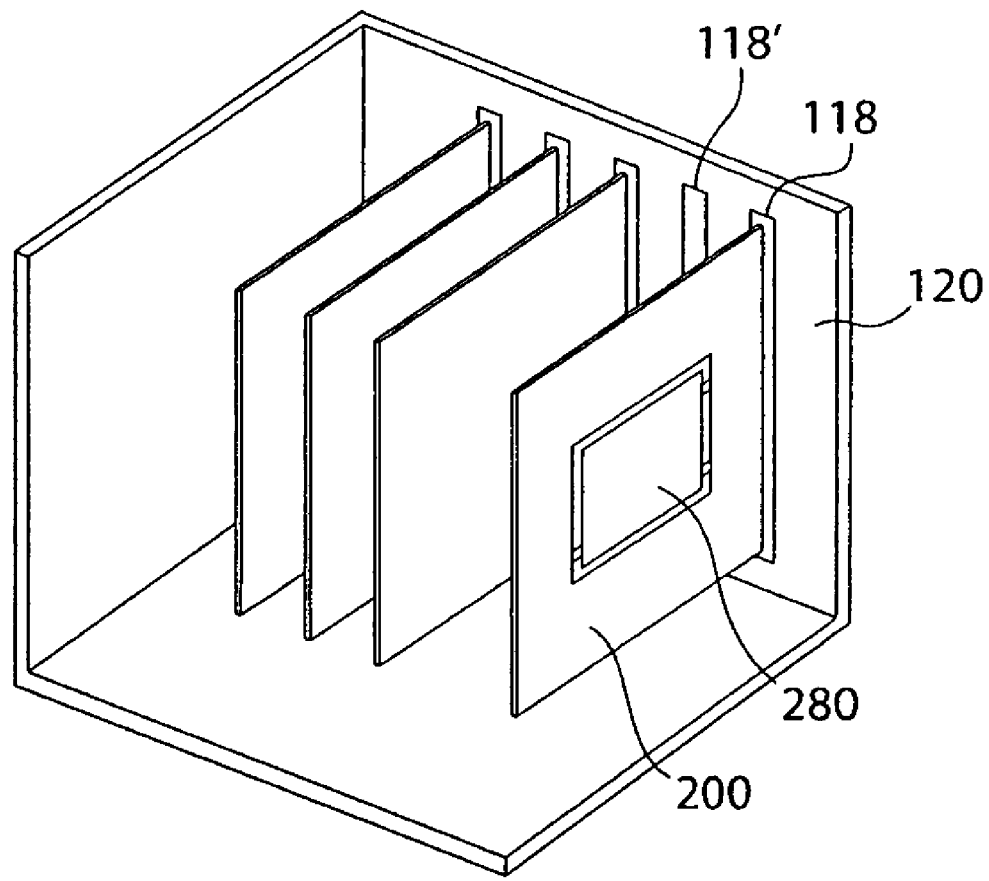
FIG. 3 illustrates an adapter frame and associated test instrument module coupled to a standard slot of a test head, according to one embodiment of the invention.

FIG. 3 illustrates adapter frame 200, including attached non-native test instrument module 280, connected to slot 118 of a test head. The slots are formed in instrument support assembly 120, which is shown as a backplane in this embodiment. For purposes herein, a "slot" does not necessarily require a recess or a depressed region, but instead refers to an area of mechanical, electrical, and/or optical fiber connectivity where a test instrument module and/or an adapter frame may be attached.

In some embodiments, the combination of adapter frame 200 and test instrument module 280 may be of a size that requires occupation of two or more slots 118 of the test head. For example, non-native test instrument module 280 may be too thick to fit within one slot, and therefore an adjacent slot, such as slot 118' may be left unoccupied to accommodate the test instrument module.

Similarly, one or more adjacent slots may be left vacant if non-native test instrument module 280 does not meet electromagnetic interference susceptibility and/or generation requirements of the tester. Alternatively, shielding may be included within the test head or as part of the adapter frame to reduce electromagnetic interference susceptibility and/or generation.

In some embodiments, the architecture of the non-native test instrument module may be configured for an air cooling system other than one provided by the test head. In such embodiments, active or passive components may be added to the adapter frame and/or test instrument module to alter the flow path of cooling air and/or to increase the quantity or speed of cooling air. In some embodiments, the test head may provide air cooling power dissipation of 480 watts per slot.

Figure 4:
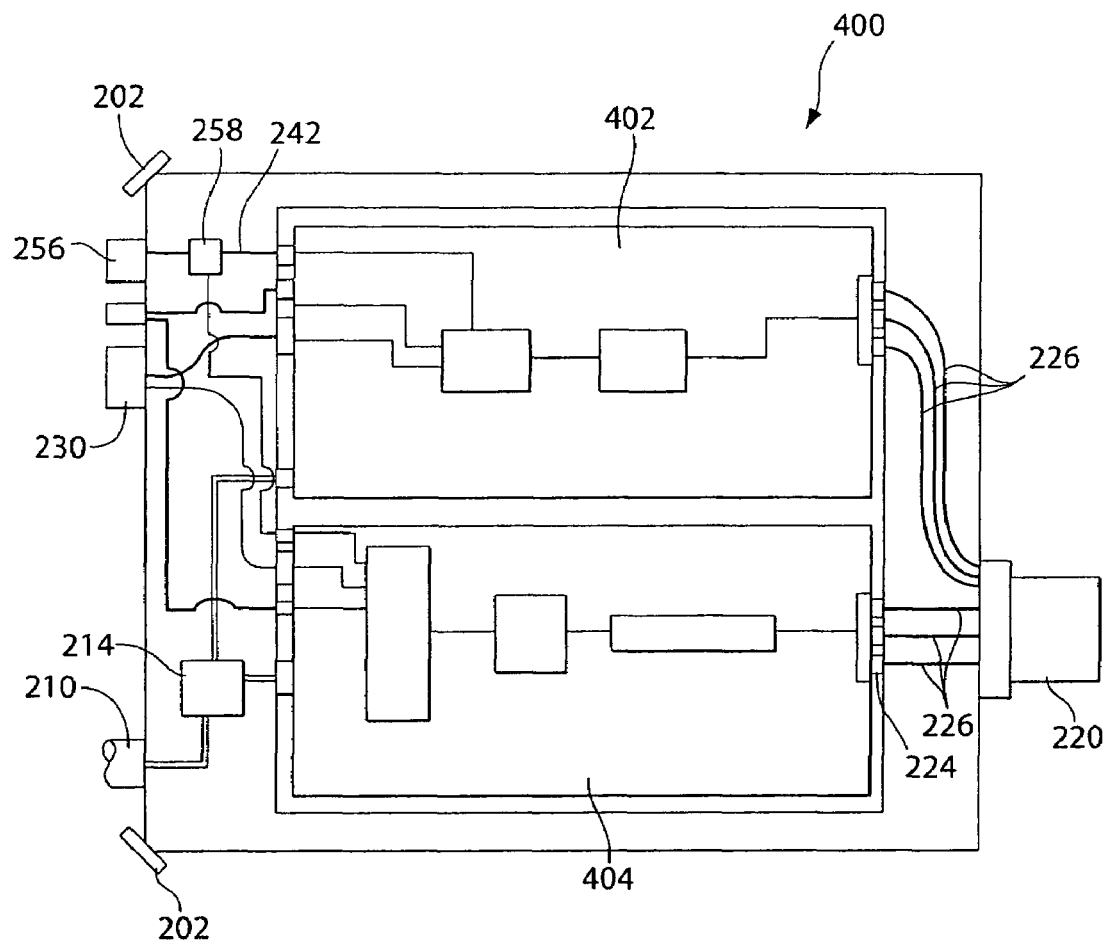
FIG. 4 illustrates two test instrument modules coupled to one adapter frame according to one embodiment of the invention.

An adapter frame may be configured to receive two or more test instrument modules. For example, as shown in FIG. 4, an adapter frame 400 may include sufficient space and interfaces incorporating two test instrument modules 402 and 404. Adapter frame 400 may include a similar number of external interfaces as an adapter frame configured to hold one test instrument module, but include twice as many internal interfaces. Adapter frame 400 may be configured to hold test instrument modules having similar physical structures as illustrated in FIG. 4, or, in some embodiments, may be configured to hold test instrument modules of different physical structures. Additionally, circuitry and/or software may be included on adapter frame 400 to allow separate control of the test instrument modules.

Figure 5:
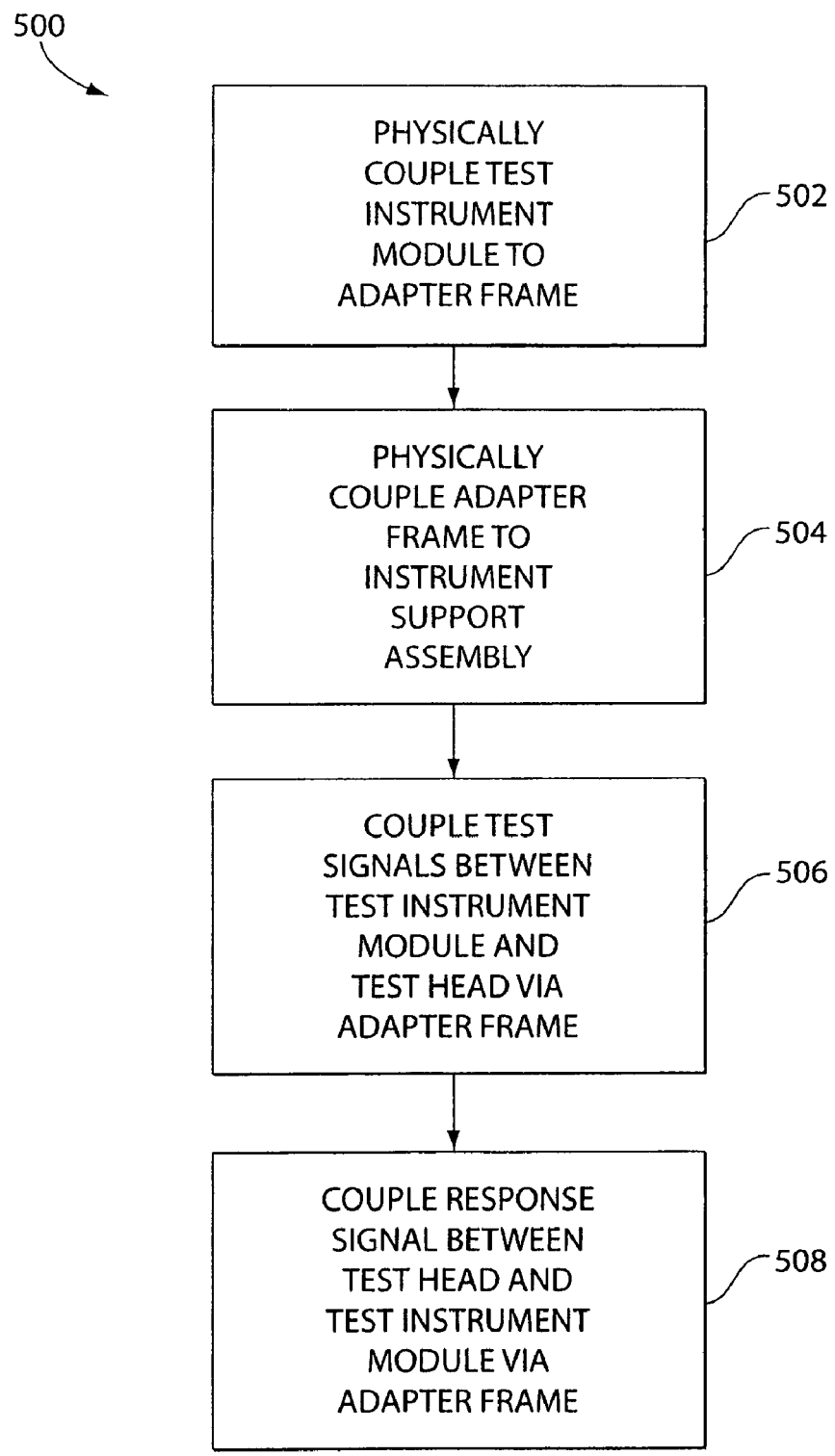
FIG. 5 shows a flowchart of one method of coupling a non-native instrument to a tester according to one embodiment of the invention.

A flowchart of a method 500 of configuring a tester with a non-native instrument is illustrated in FIG. 5. In an act 502, a test instrument module is physically coupled to an adapter frame. The coupling could occur solely as a result of various functional attachments (e.g., electrical socket connectors, liquid coolant connectors, etc.), or latches or other mechanical connectors may be used couple the two components together. In an act 504, the adapter frame is coupled to an instrument support assembly within a test head. For example, the adapter frame may be coupled to a backplane within a slot of the backplane. In an act 506, test signals are coupled between the test instrument module and the test head via the adapter frame. Response signals are coupled between the test head and the test instrument module via the adapter frame in an act 508.

Further acts may be performed to operate the tester, including acts of generating test signals within the test instrument module and applying the test signals to semiconductor devices during their manufacture. For purposes herein, the phrase "during their manufacture" refers to any point during the semiconductor manufacturing process, including testing and quality assurance occurring after some semiconductors are initially formed.

Figure 6:
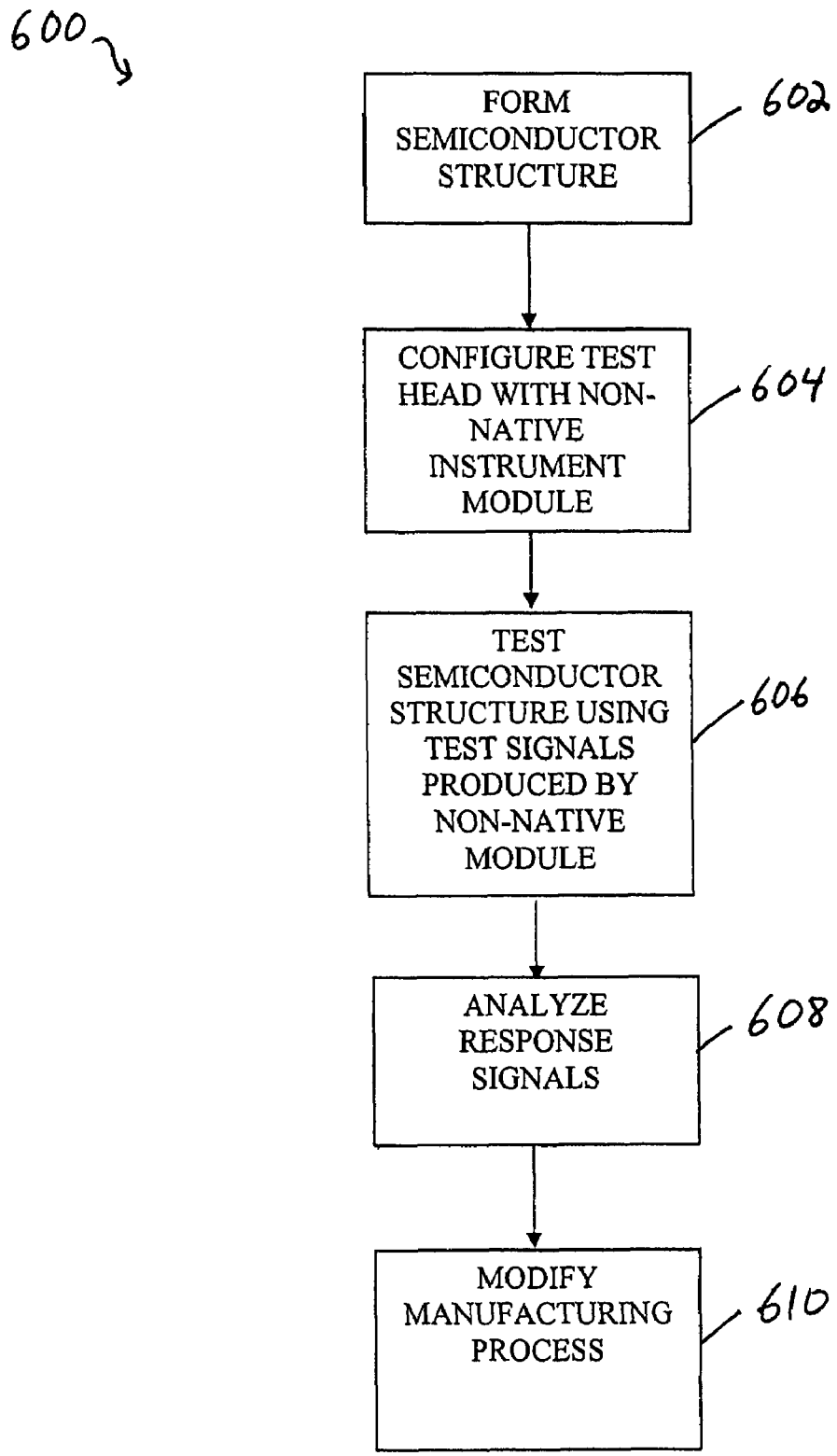
FIG. 6 shows a flowchart of one method of manufacturing a semiconductor structure according to one embodiment of the invention.

FIG. 6 shows a flowchart of a method of manufacture 600 which includes an act of using results of the testing process to modify a semiconductor structure manufacturing process. In an act 602, a semiconductor structure is formed. The test head of a tester is configured with a non-native instrument in an act 602. The non-native test instrument module is used in an act 606 to produce test signals which are applied to the semiconductor structure. Response signals are analyzed in an act 608, and the manufacturing process used to form the semiconductor structure is modified in an act 610. In some instances, the manufacturing process is modified for a single semiconductor device. For example, a test result may be used to modify the process flow for a device, with devices that do not exhibit the expected response being culled and discarded while those that do exhibit the expected result being passed to subsequent steps in the manufacturing operation.

In other instances, test results may be used to "bin" semiconductor devices. In binning parts, those devices that perform as expected in all test cases may be binned as fully functioning devices. In contrast, devices that perform as expected in some, but not all, instances may be binned as partially functioning devices. Partially functioning devices may be packaged, marked or otherwise identified as devices with degraded performance if they can perform enough functions correctly to be useful. Devices with degraded performance may be sold at a lower price than fully functioning devices. As a specific example, a microprocessor chip may be designed to operate at clock frequencies of 4 GHz. During testing, a processor that performs as expected when clocked at 4 GHz may be packaged and sold as 4 GHz processors. However, a processor that does not perform as expected at 4 GHz, but does perform as expected at 2 GHz, may be packaged and sold at a reduced price as a 2 GHz processor.

Similar binning may be performed on other types of chips, such as semiconductor devices with onboard memory. For example, a device, may be designed with 512 KB of onboard memory. If, upon testing, the results indicate that only 256 KB of memory is operational, the device may be binned for sale as a part with 256 KB of onboard memory.

In other instances, the results of testing a device may be used to control physical modifications of the part. For example, many devices containing memory are constructed with spare memory cells. If, upon testing, some memory cells are determined to be faulty, the structure of the device may be altered to disconnect the faulty memory cells and connect spare memory cells in their place. Semiconductor devices may be altered using a laser or electrical signals that make or break interconnections within the device.

In other instances, test results are used to alter the manufacturing process in a statistical sense. Results of testing numerous devices may be aggregated to identify failure patterns that indicate a misalignment or other problem at a manufacturing step. Based on this analysis, manufacturing equipment used to manufacture semiconductor devices may be adjusted so that fewer devices are manufactured with defects.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An adapter frame for integrating a test instrument module within a test head of an automatic semiconductor device test system, the test head having a plurality of slots, each slot adapted to receive an instrument, the adapter frame comprising:
   a first mechanical interface configured to receive a test instrument module;
   a separable second mechanical interface configured to mount the adapter frame within the test head in a slot of the plurality of slots;
   a separable first electrical interface separably couplable to an electrical module interface in the test head and configured to transfer data signals between the test head and the adapter frame;
   a second electrical interface couplable to an electrical interface of the test instrument module and configured to transfer data signals between the adapter frame and the test instrument module;
   a third electrical interface couplable to an electrical interface of the test instrument module and configured to transfer test signals between the test instrument module and the adapter frame;
   a separable fourth electrical interface separably couplable to a signal delivery interface of the test head and configured to transfer test signals between the adapter frame and the signal delivery interface;
   a separable first liquid coolant interface separably couplable to a liquid cooling system of the test head and configured to transfer a liquid coolant between the test head and the adapter frame;
   a second liquid coolant interface couplable to a liquid cooling system of the test instrument module and configured to transfer the liquid coolant between the adapter and the test instrument module;
   a third liquid coolant interface couplable to the liquid cooling system of the test instrument module and configured to transfer the liquid coolant between the test instrument module and the adapter frame; and
   a separable fourth liquid coolant interface separably couplable to the liquid cooling system of the test head and configured to transfer the liquid coolant between the adapter frame and the test head.

2. The adapter frame of claim 1, further comprising a liquid coolant restrictor located between the separable first liquid coolant interface and the second liquid coolant interface.

3. The adapter frame of claim 2, further comprising conduits which include additional resistance to provide a pressure drop in the liquid coolant being transferred to the test head.

4. The adapter frame of claim 1, further comprising a bypass configured to reduce the pressure of liquid coolant transferred to the test instrument module.

5. The adapter frame of claim 3, wherein the bypass comprises a bypass loop.

6. The adapter frame of claim 1, further comprising power conditioning circuitry configured to enable connection of the test instrument module to a power supply system of the automatic semiconductor device test system.

7. The adapter frame of claim 1, further comprising data signal translation circuitry configured to translate data signals received from the test head into data signals usable by the test instrument module.

8. The adapter frame of claim 1, wherein the first separable mechanical interface and the first separable electrical interface comprise components common with each other.

9. The adapter frame of claim 1, further comprising reference clock circuitry for deriving a test instrument module reference clock signal from a test head reference clock signal, the test instrument module reference clock signal having a different frequency than the test head reference clock signal.

* * * * *